United States Patent [19]

Schmidt

[11] 4,231,809
[45] Nov. 4, 1980

[54] METHOD OF REMOVING IMPURITY METALS FROM SEMICONDUCTOR DEVICES

[75] Inventor: Paul F. Schmidt, Allentown, Pa.

[73] Assignee: Bell Telephone Laboratories, Incorporated, Murray Hill, N.J.

[21] Appl. No.: 42,401

[22] Filed: May 25, 1979

[51] Int. Cl.³ .................. H01L 21/322; H01L 21/324
[52] U.S. Cl. .................................... 148/1.5; 148/187; 148/191; 357/91
[58] Field of Search .................. 148/1.5, 187, 191; 357/91

[56] References Cited

U.S. PATENT DOCUMENTS

| | | | |
|---|---|---|---|
| 3,320,103 | 5/1967 | Drake et al. | 148/191 |
| 3,556,879 | 1/1971 | Mayer | 148/191 |
| 3,929,529 | 12/1975 | Poponiak | 148/191 |
| 3,997,368 | 12/1976 | Petroff et al. | 148/1.5 |
| 4,042,419 | 8/1977 | Heinke et al. | 148/1.5 |
| 4,069,068 | 1/1978 | Beyer et al. | 148/1.5 |
| 4,116,719 | 9/1978 | Shimizu et al. | 148/1.5 |
| 4,131,487 | 12/1978 | Pearce et al. | 148/1.5 |
| 4,149,905 | 4/1979 | Levinstein et al. | 148/1.5 |

OTHER PUBLICATIONS

Rijks et al., J. Appl. Phys., 50 (Mar. 1979), 1370–1380.
Seidel et al., "Transistors . . . Annealed in . . . Oxygen . . .", IEEE, vol. ED-24, (1977), 717.
Beyer et al., "Ion Implantation Gettering . . . ", IBM-TDB, 20 (1978), 3122.
Shiraki, "S. F. Generation Suppression . . . HCl Oxidation", Jap. J. Appl. Phys., 15 (1976), 1.
Poponiak et al., "Gettering . . . Epitaxial Layer", IBM-TDB, 19 (1976), 2052.
Rozgonyi et al., "Interstitial Oxygen Gettering . . . ", Appl. Phys. Letts., 31 (1977), 343.
Hu, ". . . Oxidation S. F. in Si", Appl. Phys. Letts., 27 (1975), 165.

Primary Examiner—L. Dewayne Rutledge
Assistant Examiner—Upendra Roy
Attorney, Agent, or Firm—H. W. Lockhart

[57] ABSTRACT

A process is disclosed for gettering deleterious metal impurities, particularly the transition metals such as Cu, Fe, Co, Ni and Cr from silicon wafers by high temperature treatment for a comparatively short time in a hydrogen chloride vapor at low oxygen pressure. The low oxygen pressure inhibits the oxide growth on the silicon surfaces to thicknesses of not more than about 150 Angstroms, sufficient to protect the silicon surface but not so thick as to constitute a barrier to outdiffusion of the gettered impurities. This particular process may be preceded and followed by other previously known gettering techniques.

8 Claims, 1 Drawing Figure

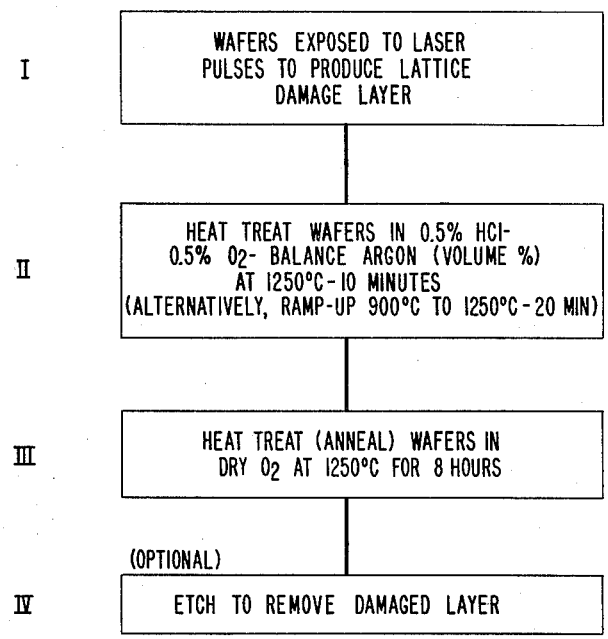

METHOD OF REMOVING IMPURITY METALS FROM SEMICONDUCTOR DEVICES

BACKGROUND OF THE INVENTION

This invention relates to a treatment for removing transition group metal impurities from silicon semiconductor material. It is particularly concerned with the removal of such impurities before and during device fabrication.

The detrimental effect of transition group metal impurities is well known and results from a complex interaction between the silicon lattice and the metal impurities, especially during high temperature heat treatments in oxygen or steam. Presence of the impurities during oxidation causes or enhances the formation of oxidation induced stacking faults in the silicon surface. These stacking faults then in turn are decorated by the metal impurities attracted by these crystal defects; the decorated defects then act as carrier recombination-regeneration centers and degrade performance of devices located in the silicon surface. It is therefore important that the silicon should be completely clean at the time the first thick layer of oxide is grown on a wafer.

The transition metal impurities include among others, copper, gold, iron, cobalt, nickel, chromium, tantalum, zinc and tungsten. These metals, even in small quantities, introduce defect sites in semiconductor material which can ultimately result in degraded device performance. The prior art is replete with techniques developed through the years for avoiding or removing such impurities in silicon semiconductor material particularly. These techniques range from "clean handling" to various gettering methods using doped glasses and other coatings, and by the use of damaged surface areas, induced by various techniques, which later are removed.

U.S. Pat. No. 3,556,879 discloses a heat treatment in an atmosphere of hydrogen chloride. It is known, as disclosed in the above-noted patent, that the metal impurities referred to hereinabove, for the most part, form volatile halides so that the reactive halide treatment constitutes an effective removal technique. However, in the above-noted patent, the hydrogen chloride etching treatment, is done in a water-vapor atmosphere, and therefore is accompanied by the formation at the outset of the process, or even before exposure to hydrogen chloride, of a relatively thick film of silicon dioxide. Our own work indicates that the effect of the hydrogen chloride is negated by the simultaneous presence of water-vapor, but not by the presence of dry oxygen.

The use of a silicon dioxide film for protection of a silicon semiconductor surface during heat treatment in a corrosive ambient in order to prevent erosion and pitting of the surface is well known. As suggested in the reference patent, this is accomplished by the provision of a silicon dioxide film of a thousand or more Angstroms in thickness which may be thermally grown or, as suggested alternatively by the reference patent, may be pyrolytically deposited.

Although gettering techniques have been widely practiced, metals of the transition group continue to be a problem as a consequence of their presence even in carefully treated silicon semiconductor material. Stacking faults produced as a consequence of the presence of these impurities during oxidation result in crystalline defects which affect the hold times of MOS memory devices as well as the switching characteristics of other silicon semiconductor devices.

A powerful measurement tool, neutron activation analysis, enables determination of extremely small amounts of impurity atoms such as the transition metals. Use of neutron activation analysis at the various stages of semiconductor device fabrication and before and after particular cleaning steps, reveals both the possible sources of contamination and the effectiveness of the cleaning processes. The results set forth in this disclosure are based, to a large extent, on analyzing impurity content before and after treatment by neutron activation analysis.

Accordingly, it is an object of this invention to remove, more effectively, impurity atoms of certain of the transition metals from silicon semiconductor material, particularly in the earlier stages of device fabrication.

SUMMARY OF THE INVENTION

In accordance with the invention a method for gettering transition metal impurities from a body of silicon semiconductor material comprises heating the body in an ambient which includes hydrogen chloride and oxygen and which is characterized by the use of a low oxygen pressure corresponding to a volume percent of not more than about one percent at a temperature in the range of 900 degrees C. to 1300 degrees C. for several minutes during which there is formed a film of silicon oxide on the body just sufficient to prevent surface erosion and pitting and having a thickness of not more than about 150 Angstroms. As noted hereinbefore, most metal halides are volatile at high temperatures and thus will be removed from a metal-contaminated body of silicon in a flowing stream of hydrogen chloride, because the metal halide concentration in the gas phase cannot build up to a significant level. However, the metal impurities must be able to distribute themselves between the solid and the gas phase according to the laws of thermodynamics. If their diffusion is kinetically impeded by an oxide film their rate of escape from the solid is sharply depressed, depending on the diffusion velocity of the particular metal in the oxide and the oxide thickness. Thus, intolerably long treatment times are required when appreciable oxide films are present.

In accordance with this invention therefore and in contrast to the teachings of the prior art, silicon semiconductor bodies are heat treated in a low concentration of hydrogen chloride and a very low oxygen pressure for a relatively short period of about 10 minutes in the temperature range of 1200 to 1300 degrees C. A ramp-up from 900 to 1250 degrees C. in 20 minutes also is effective. Typically, both the hydrogen chloride and the oxygen concentrations are about 0.5 percent and the balance of the ambient comprises a neutral nonreactive gas such as argon.

At the low oxygen concentration cited, the pressure is difficult to control exactly and the volume percentage may range from about 0.5 to 1.0. In any event, it should be just sufficient to form an oxide film in the range of not more than about 150 Angstroms which has been found sufficient to prevent erosion of the silicon surface while, at the same time, enabling rapid outdiffusion of the transition metal impurities of interest herein. In particular, the transition metal atoms effectively removed by this low oxygen heat treatment are those in the group noted hereinabove other than gold. In principle, any transition group metal which forms a volatile chloride will be removed. It has been determined that copper diffuses through silicon dioxide so readily that it can be gettered at 1250 degrees C. in hydrogen chloride even from previously oxidized silicon wafers. Gold, on the other hand, is not removed at all, because both the oxide and chloride of gold are thermodynamically unstable at high temperatures and therefore, there is no driving force to effect their removal. The low oxygen and hydrogen chloride treatment advantageously is combined with other treatments including, for example, the use of laser induced damage layers for the gettering of gold and platinum group metals whose chlorides are also thermodynamically unstable at high temperature. However, it has been found that the technique of operating the gettering process at a critically low oxygen pressure for a short period produces the quantitative removal of certain deleterious transition metals to a degree not heretofore observed.

BRIEF DESCRIPTION OF THE DRAWING

Other objects and features of the invention will be more clearly understood from the following description taken in connection with the drawing which is a block diagram of a series of steps for removing transition metal atoms from silicon semiconductor material.

DETAILED DESCRIPTION

This disclosure relates to a combined cleaning, gettering and oxidizing procedure which produces silicon wafers for making devices which are substantially free of impurities and which continues to exert an impurity gettering action throughout the device fabrication process. As indicated in block I of the drawing, the initial step may be the introduction of a layer of crystalline lattice damage in the wafer. The back surface of each wafer is exposed to a dense array of closely-spaced, powerful laser pulses. In a specific procedure, these pulses may be at a wavelength of 1.06 $\mu$m and cause local melting of the silicon to a depth of about 5 microns. The lattice damage introduced in this manner survives severe heat treatments, so that it continues to exert its gettering action throughout the device processing sequence. The presence of a gettering layer is needed if gold is to be removed because gold is not volatilized as a chloride.

After cleaning by conventional wet chemical techniques the silicon wafers are inserted into a furnace containing an ambient consisting of, by volume, 0.5 percent dry oxygen, 0.5 percent hydrogen chloride, and the balance argon. This step is outlined in block II of the drawing. Other nonreactive gases such as helium and other noble gases may be used as alternatives to argon. In a specific embodiment the temperature of the furnace at insertion of the wafers is 900 degrees C. and is increased by a ramp-up cycle to 1250 degrees C. in about 20 minutes. During this relatively brief treatment in a low oxygen ambient only a limited oxide thickness is grown on the silicon wafers. Investigation indicates that the oxide film need have a thickness of only 30 to 40 Angstroms to be effective in preventing pitting by the hydrogen chloride. As an upper limit a thickness much in excess of 100 to 150 Angstroms is undesirable from the standpoint of inhibiting outdiffusion of transition metal atoms. Where the furnace arrangement permits insertion of the wafers directly into the 1250 degrees C. ambient the duration of the treatment may be about 10 minutes. The transition metals diffuse rapidly when not impeded by thick oxide with the exception of gold which is not volatilized at all. Next, as indicated in block III, the wafers are annealed by substituting for the argon, or equivalent, dry oxygen and continuing at a temperature of about 1250 degrees C. for about 8 hours. This annealing treatment has, as one affect, the formation of oxygen precipitates in the bulk of the wafers away from later formed device regions. These precipitates act as gettering centers introduced during subsequent device processing. As is known, the annealing treatment is particularly effective in eliminating stacking faults.

Finally, as indicated in block IV, any remaining impurities, including gold, segregate in the laser induced damage layer. If desired, they can be removed by etching off the laser induced damage layer using an etchant containing by volume, 5 parts nitric acid, 5 parts hydroflouric acid, and 3 parts acetic acid.

The effectiveness of the low oxygen treatment is indicated by the following specific examples of gettering treatments including one in accordance with this invention. These experiments were done on previously neutron activated wafers, for which the impurity content hence was accurately known.

TABLE I

| Element | Wafer Heated in Steam and HCl WAFER PS 600 F | |
|---|---|---|
| | Before Treatment | After Treatment |
| Cu | $1.2 \times 10^{15}$ | $1.2 \times 10^{15}$ |
| Au | $4.5 \times 10^{11}$ | $7.3 \times 10^{12}$ |
| Fe | — | $1.4 \times 10^{15}$ |
| Co | $8.0 \times 10^{12}$ | $1.3 \times 10^{13}$ |
| Ni | $7.0 \times 10^{14}$ | $7.6 \times 10^{14}$ |
| Zn | — | — |
| Ta | — | $5.9 \times 10^{11}$ |
| Cr | $5.7 \times 10^{12}$ | $2.3 \times 10^{13}$ |

The foregoing results indicate substantially no improvement by way of removal of observed impurities using a treatment similar to that described in the U.S. patent referred to hereinabove. Specifically, the wafers were heated at about 1150 degrees C. in an atmosphere of steam and hydrogen chloride for a period of about four hours. In particular, it should be noted that, for those elements observed, there is substantially no decrease in the amount of the observed impurities present following treatment, but rather additional contamination due to impurity diffusion through the walls of the quartz furnace tube.

In contrast, the following results were observed using the treatment described herein in which wafers were ramped up from 900 degrees C. to 1250 degrees C. and immediately down again to 900 degrees C. in an atmosphere of 0.5 percent hydrogen chloride, between 0.5 percent and 1.0 percent oxygen and the balance argon.

TABLE II

| Element | WAFER PS 200 F | | WAFER PS 200 L | |
|---|---|---|---|---|
| | Before | After | Before | After |
| Cu | $1.4 \times 10^{13}$ | — | $1.4 \times 10^{12}$ | — |
| Au | $2.2 \times 10^{11}$ | $5.9 \times 10^{12}$ | $4.4 \times 10^{12}$ | $1.5 \times 10^{13}$ |
| Fe | $9.6 \times 10^{14}$ | — | $6.9 \times 10^{14}$ | — |
| Co | $2.8 \times 10^{12}$ | $1.8 \times 10^{12}$ | $2.3 \times 10^{12}$ | $8.0 \times 10^{11}$ |
| Ni | $1.1 \times 10^{14}$ | $5.7 \times 10^{13}$ | $1.2 \times 10^{14}$ | $7.1 \times 10^{13}$ |
| Cr | $1.4 \times 10^{14}$ | — | $1.4 \times 10^{14}$ | — |

For those cases after treatment indicated by a dash without a reading, the quantity present was below the level of detection. Note that, as stated hereinbefore, gold is not removed. The higher gold content after treatment is due to additional contamination from handling. Cobalt and nickel are held tenaciously at lattice defects generated by the preceding neutron activation step, hence the low efficiency of removal of these elements. For wafers not subjected to neutron activation analysis, cobalt and nickel are removed quantitatively. However, all of the other elements show a decrease in the level present, some to a very marked degree.

Thus, a relatively short heat treatment in a slight hydrogen chloride ambient with just sufficient oxidation to preserve the silicon surface from damage, reduces the level of all of the transition metals in the silicon except gold, which is susceptible to other treatments unless it has been fixed in place by substantial lattice damage.

An alternative method for providing oxygen at low pressure is by means of a redox couple such as carbon monoxide (CO) and carbon dioxide ($CO_2$). By choosing the ratio of the components of the redox couple at a given elevated temperature, a fixed oxygen pressure can be established. This oxygen is available in the same manner as that introduced in elemental form to the treatment chamber.

I claim:

1. In a process for gettering transition metal impurities from a body of silicon semiconductor material which comprises heating the body in an ambient which includes hydrogen chloride and oxygen the improvement comprising the ambient contains oxygen in a percentage by volume of from about 0.5 and 1.0 to grow a silicon oxide film on the surface of said body to a thickness of not more than about 150 Angstroms.

2. The process in accordance with claim 1 in which the hydrogen chloride is present in a percentage by volume of about 0.5.

3. The process in accordance with claim 2 in which the body is heated in the range from 900 degrees C. to 1300 degrees C.

4. The process in accordance with claim 3 in which said body is placed in a furnace at 900 degrees C. and then ramped up to 1250 degrees C. in a period of about 20 minutes.

5. The process in accordance with claim 3 in which said body is heated at a temperature of about 1250 degrees C. for about 10 minutes.

6. In a process for gettering transition metal impurities from a body of silicon semiconductor material which comprises heating the body in an ambient which includes hydrogen chloride and dry oxygen the improvement comprising the ambient comprises by volume, hydrogen chloride about 0.5 percent, oxygen from about 0.5 to 1.0 percent, and the balance argon.

7. The method in accordance with claim 6 in which the body is placed in a furnace at about 900 degrees C. and ramped up to a temperature of about 1250 degrees C. in about 20 minutes.

8. The process in accordance with claim 6 in which said body is heated at a temperature of about 1250 degrees C. for about ten minutes.

* * * * *